(12) United States Patent
Itoh

(10) Patent No.: US 6,259,612 B1
(45) Date of Patent: Jul. 10, 2001

(54) SEMICONDUCTOR DEVICE

(75) Inventor: Yasuo Itoh, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/665,071

(22) Filed: Sep. 19, 2000

(30) Foreign Application Priority Data

Sep. 20, 1999 (JP) .................................................. 11-266144

(51) Int. Cl.⁷ .............................. G05F 1/10; H02M 3/18
(52) U.S. Cl. .............................................. 363/60; 327/536
(58) Field of Search ..................... 363/59, 60; 327/536, 327/538, 540, 545; 307/110; 323/282, 284, 285

(56) References Cited

U.S. PATENT DOCUMENTS

| | | | |
|---|---|---|---|
| 5,796,296 | * | 8/1998 | Krzentz .................................. 327/545 |
| 5,835,420 | * | 11/1998 | Lee et al. ......................... 365/189.09 |
| 6,066,943 | * | 5/2000 | Hastings et al. ...................... 323/285 |
| 6,107,862 | * | 8/2000 | Mukainakano et al. ............. 327/536 |
| 6,154,088 | * | 11/2000 | Chevallier et al. ................... 327/536 |

FOREIGN PATENT DOCUMENTS 11-122109   4/1999   (JP) .

OTHER PUBLICATIONS

Randall L. Geiger, et al., "VLSI Design Techniques for Analog and Digital Circuits", Chapter 8 (Analog Systems), Figures 8.2–15.

* cited by examiner

Primary Examiner—Adolf Deneke Berhane
(74) Attorney, Agent, or Firm—Banner & Witcoff, Ltd.

(57) ABSTRACT

An internal voltage generator generates an internal voltage that is obtained by up-converting or down-converting an external power supply voltage. A resistor-voltage divider, having a plurality of resistors, outputs a first divided voltage that is obtained by dividing the internal voltage according to a resistance ratio of the resistors. A capacitor-voltage divider, having a plurality of capacitors connected in series between an output terminal of the internal voltage generator and a ground level, outputs a second divided voltage from the capacitors. A comparator compares a reference voltage and the first divided voltage for controlling the internal voltage generator according to a result of comparison. The comparator judges whether to halt operation of the internal voltage generator or not based on the result of comparison between the reference voltage and the first divided voltage while the internal voltage generator is operating. On the other hand, the comparator operates the internal voltage generator based on the result of comparison between the reference voltage and the second divided voltage while the internal voltage generator is not operating. The comparator further controls the resistor-voltage divider so that a current flows therethrough only when the internal voltage generator is operating.

15 Claims, 9 Drawing Sheets

SEMICONDUCTOR DEVICE

BACKGROUND OF THE INVENTION

The present invention relates to a semiconductor device for generating voltages that are used as internal power supply voltages for semiconductor devices, such as, DRAMS, by using an external power supply voltage fed by a peripheral circuitry.

Semiconductor devices, such as, DRAMS, operating at several levels of power supply voltages in the internal circuitry are provided with an up- or a down-converter for up-converting or down-converting an external power supply voltage fed by a peripheral circuitry.

Shown in FIG. 12 is a circuit diagram of a typical up-converter.

The up-converter is provided with an operational amplifier 1, a resistor-voltage divider 5 connected to the positive input terminal of the operational amplifier 1, and an inverter IV1 connected to the output terminal of the operational amplifier 1, a ring oscillator 2 driven by the output of the inverter IV1, a charge pump 3 driven by the output of the ring oscillator 2, and a capacitor Cpp connected to the output terminal of the charge pump 3.

The resistor-voltage divider 5 divides an up-converted voltage Vpp that has been up-converted by the charge pump 3.

The operational amplifier 1 compares a divided voltage TAP of the resistor-voltage divider 5 with a reference voltage VBGR, to output a positive signal if the former voltage level is higher than the latter, whereas a negative signal if the latter is higher than the former.

This results in an output OSCE of the inverter IV1 being brought into a low level state if TAP>VBGR, whereas a high level if TAP<VBGR.

The reference voltage VBGR is set at, for example, 1.25V, that is generated by a band-gap reference circuit (not shown) exhibiting no thermal behavior.

Illustrated in FIG. 13 are voltage waveforms of the up-converted voltage Vpp, the divided voltage TAP, and the output OSCE of the inverter IV1.

The operation of the up-converter shown in FIG. 12 will be explained with reference to the voltage waveforms illustrated in FIG. 13.

Transition of the up-converted voltage Vpp from its stable condition (a desired voltage level) to a lower level with the divided voltage TAP lower than the reference voltage VBGR triggers the transition of the inverter output voltage OSCE from a low to a high level.

This voltage transition initiates the ring oscillator 2 for oscillation and also the charge pump 3 for up-conversion.

The up-converted voltage Vpp at a high level gradually raises the divided voltage TAP higher than the reference voltage VBGR, thus the inverter output voltage OSCE being brought into a low level state.

This voltage transition halts the oscillation of the ring oscillator 2 and also the up-conversion of the charge pump 3.

Repetition of the operation described above obtains the up-converted voltage Vpp expressed as follows:

$$Vpp=\{1+(R2/R1)\} \times VBGR \ldots \quad (1)$$

Shown in FIG. 14 is the equivalent circuit of the operational amplifier 1 of FIG. 12.

The operational amplifier 1 shown in FIG. 14 is provided with PMOS transistors Q1 and Q2 that constitute a current mirror, NMOS transistors Q3 and Q4 that turns on or off according to the logic of an input signal, an NMOS transistor Q5 that enables or disables the operational amplifier 1, and an NMOS transistor Q6 that validates or invalidates the output of the operational amplifier 1.

In FIG. 14, the transistor Q3 turns on when its gate voltage is higher than a gate voltage of the transistor Q4, thus the transistors Q1 and Q2 turn on to generate an output voltage VOUT almost equal to the positive power supply voltage Vdd.

On the other hand, the transistor Q4 turns on when its gate voltage is lower than a gate voltage of the transistor Q3, thus an output voltage VOUT becoming almost equal to the ground level.

Present DRAMs and FRAMs, etc., turn on its up-converter in operation when the memories are on (an operating mode), whereas turns it off when the memories are off (a waiting mode) for power saving. Up-converted power supply voltages are, however, used at many sections of the memories, thus resulting in a heavy load. Such an up-converter control takes a considerably long time for up-converting power supply voltages at desired levels.

An up-converter shown in FIG. 15 has been proposed for solving such a problem.

The up-converter shown in FIG. 15 is provided with a voltage controller 21a for the operating mode and a voltage controller 21b for the waiting mode. Both controllers have almost the same circuitry. An operational amplifier Is of the voltage controller 21b is a low power consumption-type. Resistors R1H and R2H in the voltage controller 21b have resistance higher than those of resistors R1L and R2L in the voltage controller 21a.

The operational amplifier 1a operates when a signal "active" indicating the operating mode is high, whereas and the operational amplifier 1b operates when a signal "standby" indicating the waiting mode is high.

The up-converter shown in FIG. 15, however, has the following drawbacks:

The driving performance of the up-converter is preferably restricted in the waiting mode because almost no circuitry in the semiconductor device operates in this mode. The waiting mode requires a small current consumed by the operational amplifier 1s, while larger resistance for the resistors R1H and R2H that constitute the resistor-voltage divider 5 (FIG. 12) for a small pass-current.

Decrease in current consumed by the operational amplifier 1s can be achieved by a well known technique, such as, provision of a current-limiting transistor.

However, the larger the resistance of the resistors R1H and R2H, the larger the area of resistor-wiring, and the larger the stray capacitance of the resistor-wiring. This results in signal delay due to resistor and capacitor, which causes a low voltage-feedback control.

Not only the up-converter, but also the down-converter has the same disadvantages as discussed below.

Shown in FIG. 16 is a circuit diagram of a typical down-converter.

The down-converter is provided with an operational amplifier 1, a PMOS transistor Q8, and resistors R1 and R2 that constitute a resistor-voltage divider.

Decrease in down-converted voltage Vout lower than a desired voltage causes decrease in a divided voltage TAP of the resistor-voltage divider lower than a reference voltage VBGR, which brings the output of the operational amplifier 1 into a lower level, to turn on the transistor Q8 for raising the voltage Vout.

Shown in FIG. 17 is a circuit diagram of another typical down-converter, provided with voltage controllers for the operating and waiting modes.

Like the up-converter shown in FIG. 12, the down-converter (FIG. 17) inevitably has a large chip size, a large delay through wiring, and a high production cost for power saving in the waiting mode due to the existence of resistor-voltage divider.

SUMMARY OF THE INVENTION

A purpose of the present invention is to provide a semiconductor device having a small chip size for power saving.

The present invention provides a semiconductor device including: an internal voltage generator for generating an internal voltage that is obtained up-converting or down-converting an external power supply voltage; a resistor-voltage divider, having a plurality of resistors, to output a first divided voltage that is obtained by dividing the internal voltage according to a resistance ratio of the first resistors; a capacitor-voltage divider, having a plurality of capacitors connected in series between an output terminal of the internal voltage generator and a ground level, to output a second divided voltage from the capacitors; and a comparator to compare a reference voltage and the first divided voltage for controlling the internal voltage generator according to a result of comparison, the comparator judging whether to halt operation of the internal voltage generator or not based on the result of comparison between the reference voltage and the first divided voltage while the internal voltage generator is operating, on the other hand, the comparator operating the internal voltage generator based on the result of comparison between the reference voltage and the second divided voltage while the internal voltage generator is not operating, the comparator further controlling the resistor-voltage divider so that a current flows therethrough only when the internal voltage generator is operating.

Moreover, the present invention provides a semiconductor device including: an internal voltage generator for generating an internal voltage that is obtained up-converting or down-converting an external power supply voltage; a resistor-voltage divider, having a plurality of resistors, to output a first divided voltage that is obtained by dividing the internal voltage according to a resistance ratio of the resistors; a capacitor-voltage divider, having a plurality of capacitors connected in series between an output terminal of the internal voltage generator and a ground level, to output a second divided voltage from the capacitors; and a comparator to compare a reference voltage and the first divided voltage for controlling the internal voltage generator according to a result of comparison, the comparator controlling the first resistor-voltage divider so that no current flows therethrough when the internal voltage generator is out of operation, to operate the internal voltage generator based on the result of comparison between the reference voltage and the second divided voltage.

Furthermore, the present invention provides a method of controlling an internal voltage of a semiconductor device, including the steps of: generating an internal voltage that is obtained up-converting or down-converting an external power supply voltage; outputting a first divided voltage that is obtained by dividing the internal voltage according to a resistance ratio of a plurality of resistors; connecting the internal voltage and a ground level via capacitance, to output a second divided voltage by the capacitance-connection; judging whether or not to halt the internal voltage generation according to a result of comparison between a reference voltage and the first divided voltage while the internal voltage generation is proceeding, on the other hand, starting the internal voltage generation according to the result of comparison between the reference voltage and the second divided voltage while the internal voltage generation is not proceeding; and outputting the first divided voltage only when the voltage obtained up-converting or down-converting the external power supply voltage is being generated.

Moreover, the present invention provides a method of controlling an internal voltage of a semiconductor device, including the steps of: generating an internal voltage that is obtained up-converting or down-converting an external power supply voltage; outputting a first divided voltage that is obtained by dividing the internal voltage according to a resistance ratio of a plurality of resistors; connecting the internal voltage and a ground level via capacitance, to output a second divided voltage by the capacitance-connection; placing the first divide-voltage as a ground level when the internal voltage obtained up-converting or down-converting the external power supply voltage is not generated; starting the internal voltage generation according to the result of comparison between a reference voltage and the second divided voltage.

DETAILED DESCRIPTION OF PREFERRED EMBODIMENTS

Preferred embodiments according to the present invention will be disclosed with reference to the attached drawings.

Disclosed below, as examples of a semiconductor device, are an up-converter that up-converts a power supply voltage fed by the external circuitry and a down-converter that down-converts the externally-fed power supply voltage.

In the following disclosure, an up-converted voltage is an internal voltage obtained by up-converting a power supply voltage fed by the external circuitry and a down-converted voltage is an internal voltage obtained by down-converting the externally-fed power supply voltage.

[The First Preferred Embodiment]

The feature of the first embodiment of the up-converter lies in low power consumption in the waiting mode.

Figure 1:
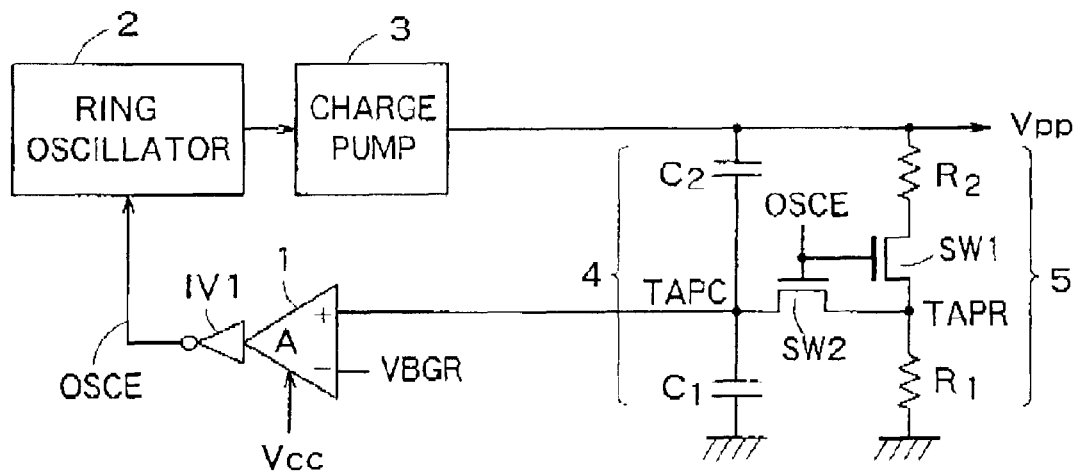
FIG. 1 shows a circuit diagram of an up-converter as the first preferred embodiment according to the present invention.

Shown in FIG. 1 is first embodiment of the up-converter. Elements in this embodiment that are the same as or analogous to elements in FIG. 12 are referenced by the same reference numbers.

Figure 12:
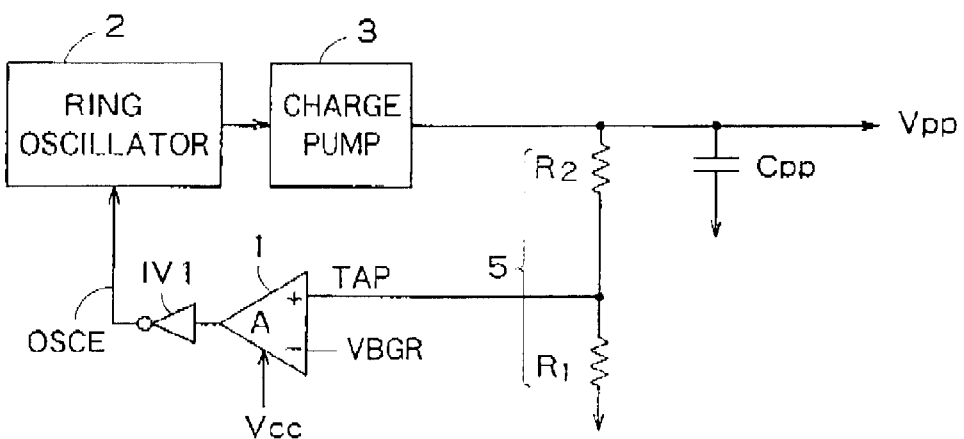
FIG. 12 shows a circuit diagram of a typical up-converter.
Figure 13:
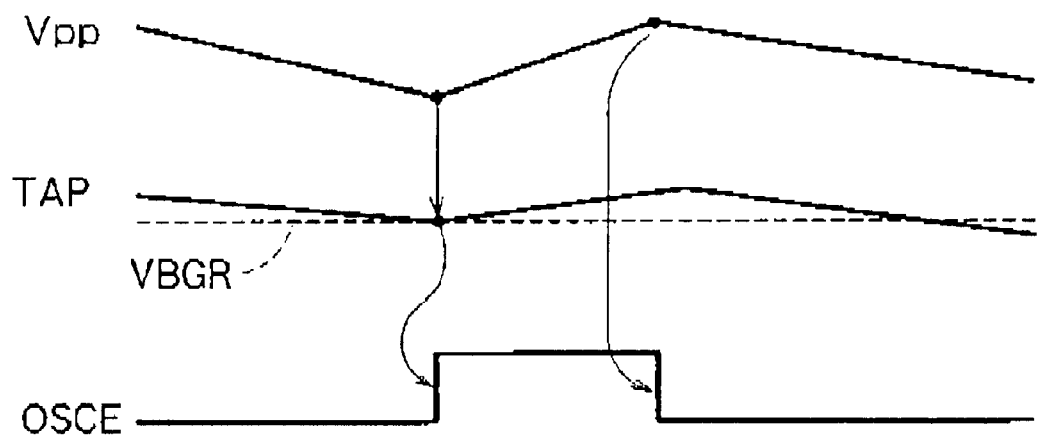
FIG. 13 illustrates waveforms of an up-converted voltage Vpp, a divided voltage TAP, and an output voltage OSCE of an inverter IV1 shown in FIG. 12.

Like shown in FIG. 12, the up-converter (FIG. 1) is provided with an operational amplifier 1 (the first operational amplifier), an inverter IV1, a ring oscillator 2, and a charge pump 3.

In addition to these elements, the up-converter (FIG. 1) is provided with a capacitor-voltage divider 4 constituted by capacitors C1 and C2 series-connected between an up-converted Vpp and the ground level, a first resistor-voltage divider 5 constituted by resistors R1 and R2 series-connected between the up-converted Vpp and the ground level, an NMOS transistor switch SW1 (the first switch) connected between the resistors R1 and R2, and an NMOS transistor switch SW2 (the second switch) connected between the divided-voltage output terminals of the capacitor-voltage divider 4 and the first resistor-voltage divider 5.

Figure 14:
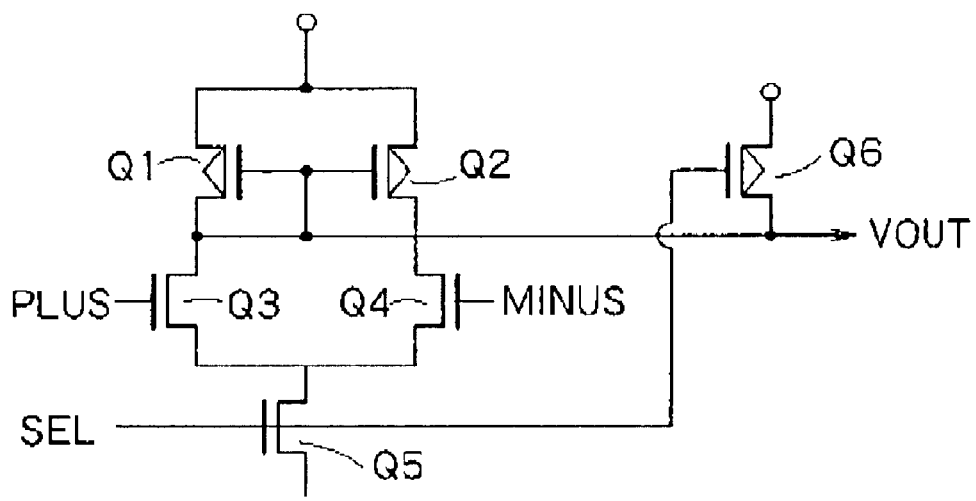
FIG. 14 shows the equivalent circuit of the operational amplifier shown in FIG. 12.
Figure 15:
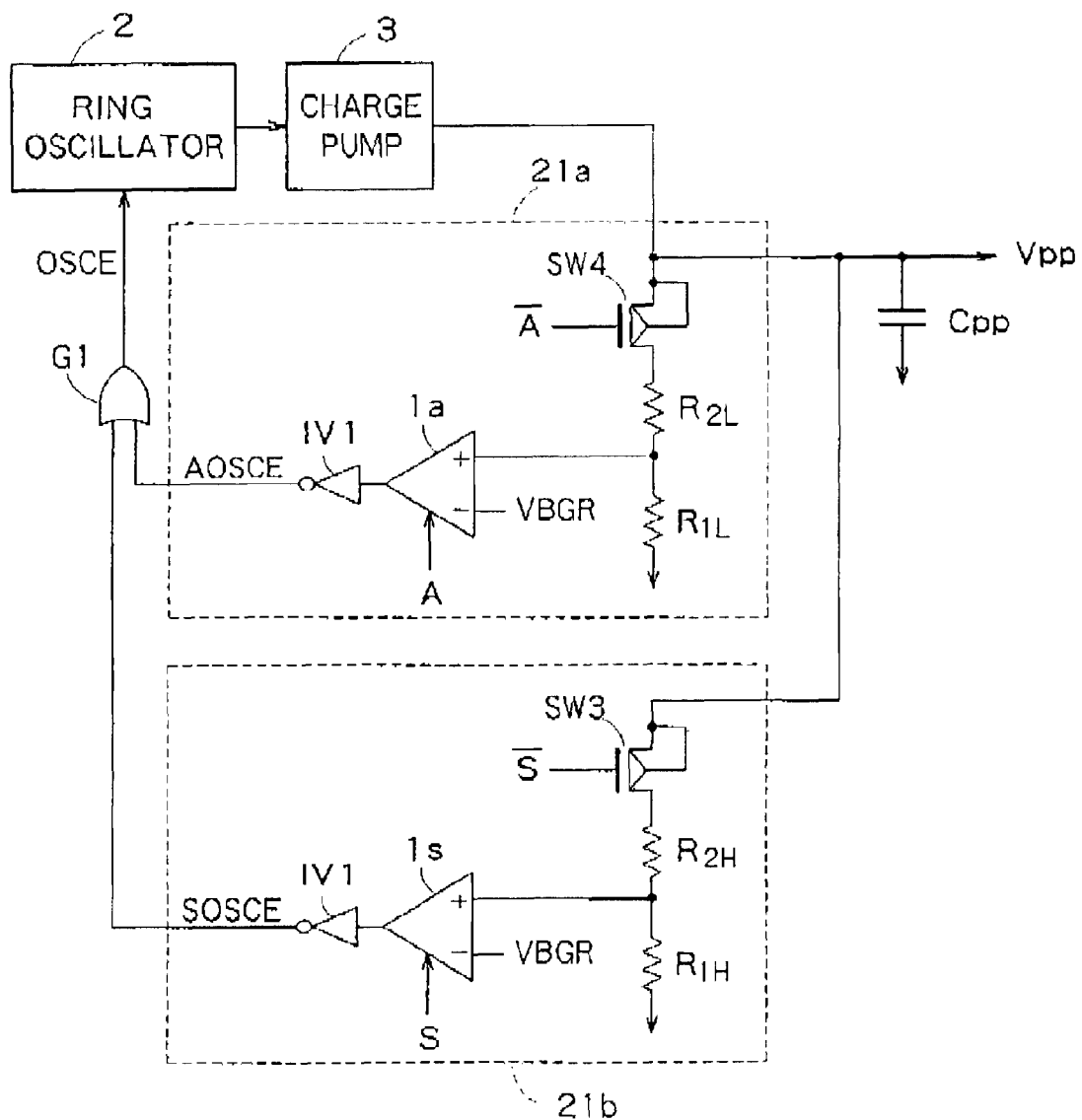
FIG. 15 shows a circuit diagram of a typical up-converter provided with a voltage controller for an operating mode and a voltage controller for a waiting mode.
Figure 16:
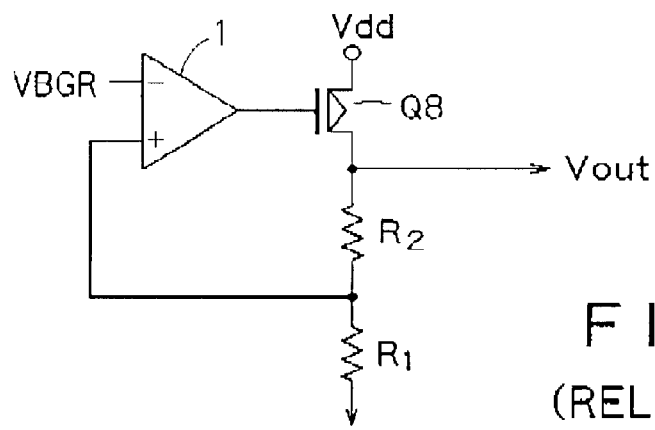
FIG. 16 shows is a circuit diagram of a typical down-converter.
Figure 17:
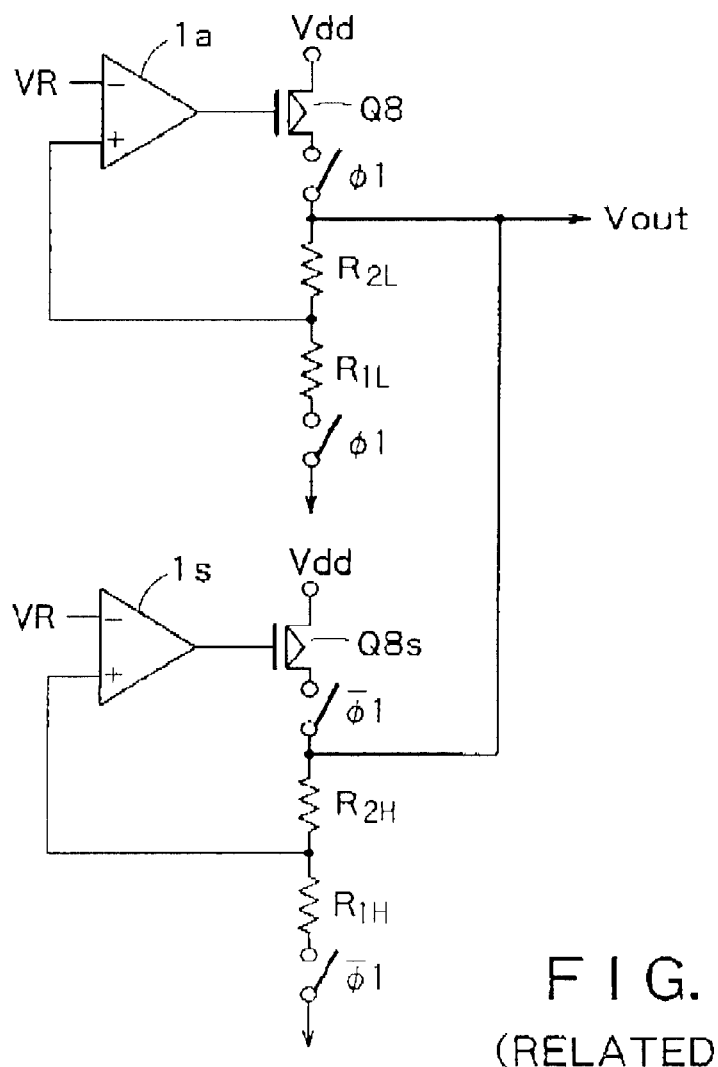
FIG. 17 shows a circuit diagram of another typical down-converter provided with voltage controllers for the operating and waiting modes.

The output OSCE of the inverter IV1 is fed to both gates of the transistor switches SW1 and SW2. The operational amplifier 1 is constructed as shown in FIG. 14. The ring oscillator 2 and charge pump 3 constitute an internal voltage generator.

The operation of the up-converter shown in FIG. 1 is disclosed.

A steady state provides the same voltage to the positive input terminal TAPC and the negative input terminal VBGR of the operational amplifier 1.

Increase in up-converted voltage Vpp over a desired voltage triggers the operational amplifier 1 to output a positive output voltage, that brings the output OSCE of the inverter INV1 into a low level state. This voltage transition halts the oscillation of the ring oscillator 2; hence the charge pump 3 stops an up-conversion operation.

As time lapses under no up-conversion operation, the up-converted voltage Vpp gradually decreases due to leakage at PN-junction capacitance of transistors of a load circuitry (not shown) to which the up-converted voltage Vpp is supplied.

Decrease in up-converted voltage Vpp lower than the desired voltage causes decrease in a voltage at the positive input terminal TAPC of the operational amplifier 1 lower than the reference voltage VBGR. The output of the operational amplifier 1 thus lowers to bring the output of the inverter INV1 into a high level. This transition initiates the oscillation of the ring oscillator 2; hence the charge pump 3 starts an up-conversion operation.

The high level-output of the inverter INV1 turns on the transistor switches SW1 and SW2, which provides the same voltage level to the positive input terminal TAPC of the operational amplifier 1 and the node TAPR of the resistors R1 and R2.

As disclosed, the up-converted Vpp is controlled by means of the resistors R1 and R2 during the up-conversion operation of the charge pump 3.

On the other hand, increase in up-converted voltage Vpp higher than the desired voltage causes increase in a voltage at the positive input terminal TAPC of the operational amplifier 1 higher than the reference voltage VBGR, to bring the output of the inverter INV1 into a low level. This transition halts the oscillation of the ring oscillator 2; hence the charge pump 3 stops the up-conversion operation.

The non-up-conversion state turns off the transistor switches SW1 and SW2, thus no current flowing through the resistors R1 and R2. The up-converted voltage Vpp is then detected only by the capacitors C1 and C2.

As disclosed, while the charge pump 3 executes no up-conversion operation, or during decrease in up-converted voltage Vpp, the up-converted voltage Vpp is detected only by the capacitors C1 and C2. Decrease in up-converted voltage Vpp lower the desired voltage again brings the output of the inverter INV1 into a high level state to initiate the up-conversion operation of the charge pump 3.

As disclosed above, the first embodiment is provided with the transistor SW1 between the resistors R1 and R2 constituting the first resistor-voltage divider 5 and the capacitor-voltage divider 4 connected to the positive input terminal of the operational amplifier 1. The up-converted voltage Vpp in the waiting mode (no up-conversion operation by the charge pump 3) is detected only by the capacitor-voltage divider 4 while no current is flowing through the first resistor-voltage divider 5. The first embodiment thus achieves power saving in the waiting mode.

[The Second Preferred Embodiment]

The feature of the second embodiment of the up-converter lies also in low power consumption in the waiting mode, lower than the first embodiment.

Figure 2:
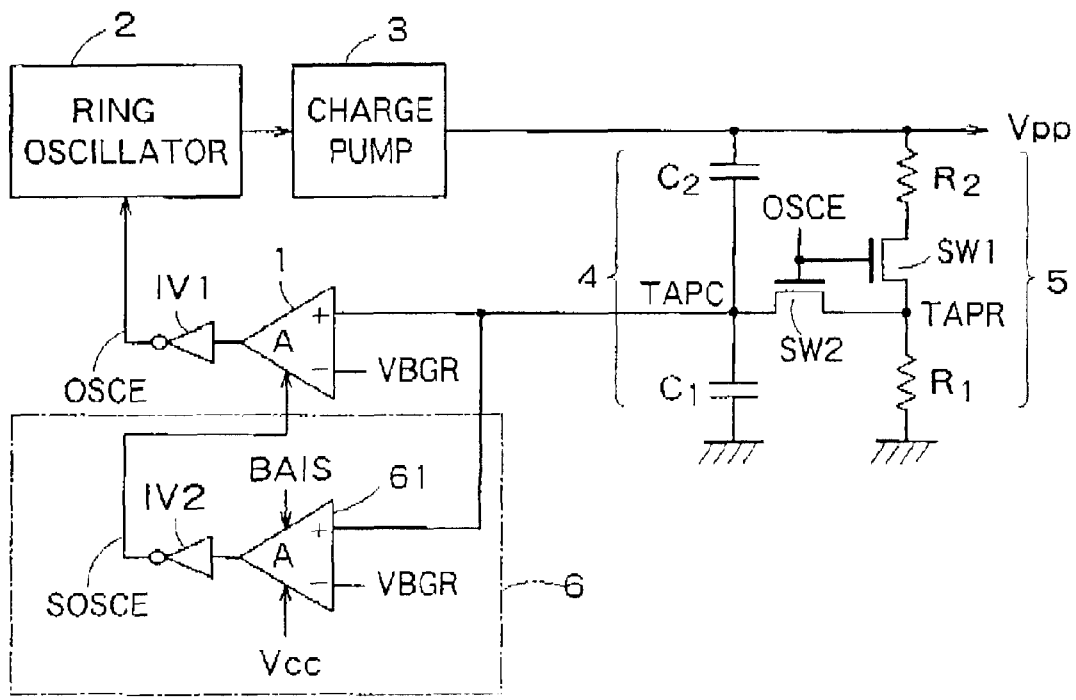
FIG. 2 shows a circuit diagram of an up-converter as the second preferred embodiment according to the present invention.

Shown in FIG. 2 is the second embodiment of the up-converter. Elements in this embodiment that are the same as or analogous to elements in FIG. 1 are referenced by the same reference numbers.

The second embodiment is unique in a power controller 6 that controls a power supply voltage fed to the power supply terminal of the operational amplifier 1.

The power controller 6 is provided with an operational amplifier 61 (the second operational amplifier) and an inverter IV2 connected to the output terminal of the operational amplifier 61.

The operational amplifier 61 operates at an operating speed slower than the operational amplifier 1, however, is a low power consumption-type with a small operating current.

Like the operational amplifier 1, the operational amplifier 61 compares a divided voltage TAPC of the capacitor-voltage divider 4 and the reference voltage VBGR. The power supply voltage Vcc is always supplied to the power supply terminal of the operational amplifier 61, different from the operational amplifier 1.

Figure 3:
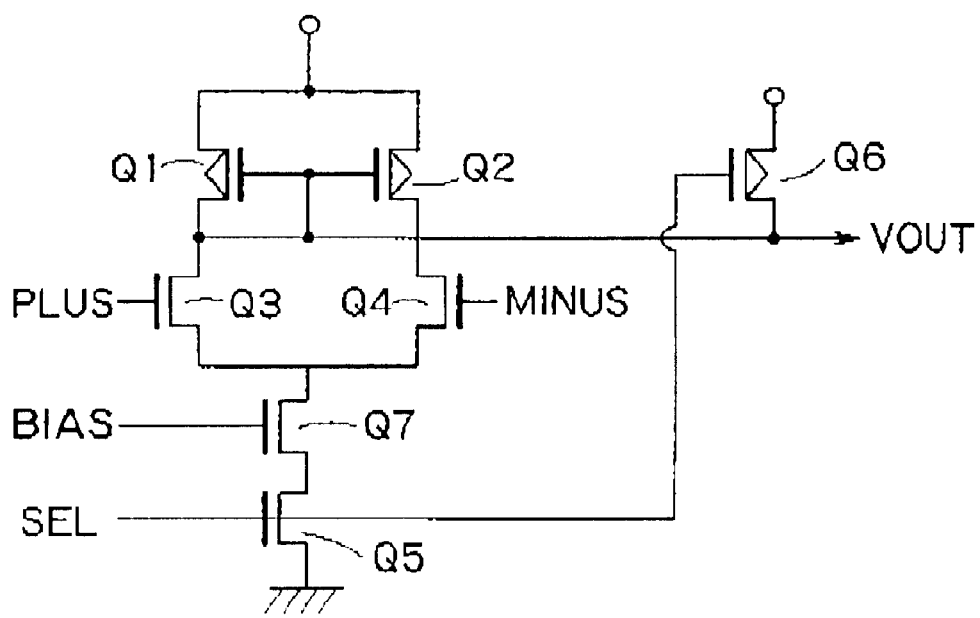
FIG. 3 shows a circuit diagram of an operational amplifier 61 shown in FIG. 2.

Shown in FIG. 3 is the circuitry of the operational amplifier 61. The circuit components in FIG. 3 that are the same as or analogous to elements in FIG. 14 are referenced by the same reference numbers.

As shown in FIG. 3, the operational amplifier 61 is provided with a transistor Q7 between the transistors Q3 and Q4, and the transistor Q5.

Control of a gate voltage BIAS of the transistor Q7 limits a current flowing from the transistors Q1 to Q4 for decrease in current consumption.

Figure 4:
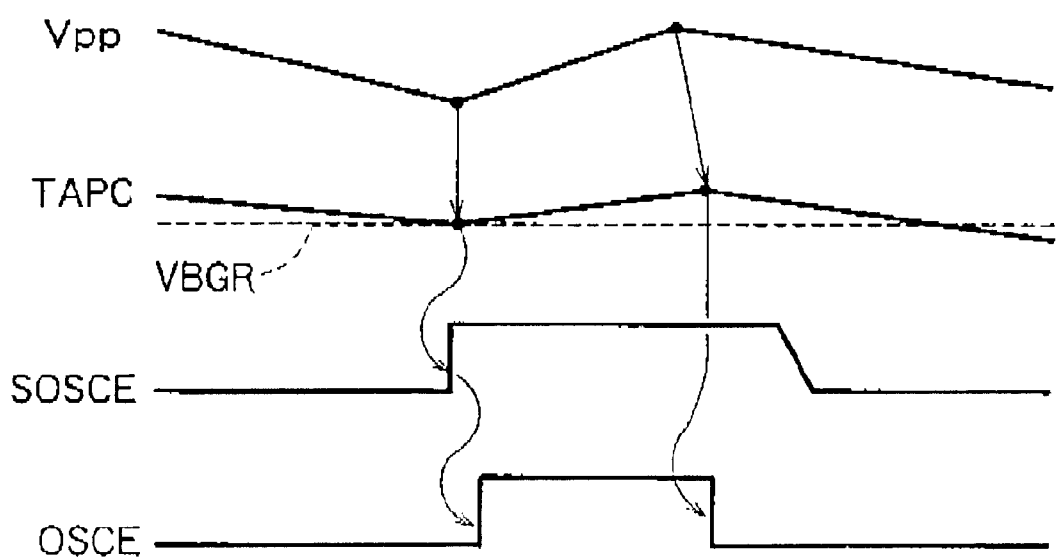
FIG. 4 illustrates waveforms of an up-converted voltage Vpp, a voltage at a positive input terminal TAPC of an operational amplifier 1, an output voltage SOSCE of a power controller 6, and an output voltage OSCE of an inverter IV1 shown in FIG. 2.

Illustrated in FIG. 4 are voltage waveforms of the up-converted voltage Vpp, the voltage at the positive input terminal TAPC of the operational amplifier 1, the output voltage SOSCE of the power controller 6, and the output OSCE of the inverter IV1.

The operation of the up-converter shown in FIG. 2 will be explained with reference to the voltage waveforms illustrated in FIG. 4.

A steady state provides the same voltage to the positive input terminal TAPC and the negative input terminal VBGR of the operational amplifier 1.

Increase in up-converted voltage Vpp over a desired voltage raises the output voltage of the operational amplifier 1 to bring the output OSCE of the inverter INV1 into a low level state. This voltage transition halts the oscillation of the ring oscillator 2; hence the charge pump 3 stops an up-conversion operation.

The transistors SW1 and SW2 are turned off during no up-conversion operation; hence the up-converted voltage Vpp is detected only by the capacitor-voltage divider 4.

Increase in up-converted voltage Vpp over the desired voltage also raises the output voltage of the operational amplifier 61 to bring the output voltage of the inverter INV2 into a low level state, thus no power supply voltage being fed to the power supply terminal of the operational amplifier 1.

As disclosed, no up-conversion operation by the charge pump 3 provides no current to the first resistor-voltage divider 5 and also the operational amplifier 1, for achieving further power saving.

On the other hand, decrease in up-converted voltage Vpp below the desired voltage lowers the output voltage of the operational amplifier 61 to bring the output voltage of the inverter INV2 into a high level state. The power supply voltage is thus fed to the power supply terminal of the operational amplifier 1 to operate again. The decrease in up-converted voltage Vpp brings the output of the operational amplifier 1 into a low level for initiating the oscillation of the ring oscillator 2, hence the charge pump 3 re-starting the up-conversion operation.

The high-level output voltage of the inverter INV2 turns on the transistor switches SW1 and SW2 to provide almost the same voltage to the positive input terminal TAPC of the operational amplifier 1 and the divided voltage TAPR of the first resistor-voltage divider 5.

As disclosed, the up-conversion operation by the charge pump 3 provides a current to the first resistor-voltage divider 5 and the power supply voltage to the operational amplifier 1. The operational amplifier 1 thus controls the up-converted voltage Vpp with the first resistor-voltage divider 5.

As disclosed above, the second embodiment provides no power supply voltage to the operational amplifier 1 so as not to control the up-converted voltage Vpp during no up-conversion operation of the charge pump 3, thus achieving further power saving compared to the first embodiment.

[The Third Preferred Embodiment]

The third embodiment is a modification of the first and second embodiments, for achieving a stable positive input voltage to the operational amplifier.

Figure 5:
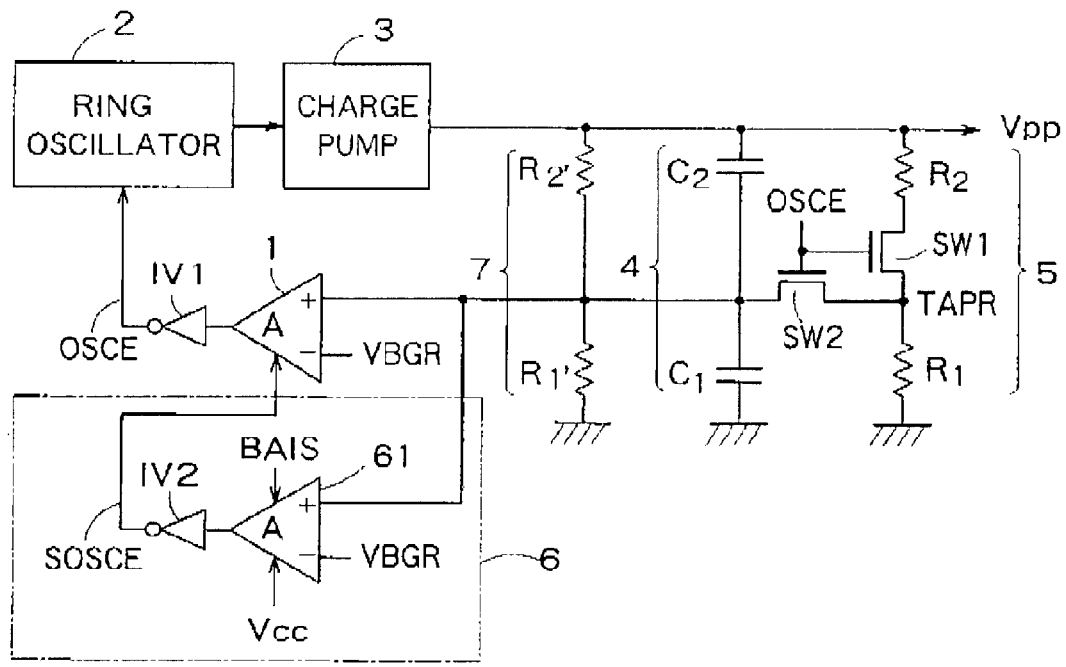
FIG. 5 shows a circuit diagram of an up-converter as the third preferred embodiment according to the present invention.

Shown in FIG. 5 is third embodiment of the up-converter. Elements in this embodiment that are the same as or analogous to elements in FIG. 2 are referenced by the same reference numbers.

The third embodiment is unique in a second resistor-voltage divider 7 in addition to the elements of the second embodiment. The second resistor-voltage divider 7 is constituted by resistors R1' and R2' connected between the up-converted voltage Vpp and the ground level.

In the second embodiment shown in FIG. 2, no up-conversion operation of the charge pump 3 turns off the transistor switches SW1 and SW2, so that the positive input terminal of the operational amplifier 1 is connected only to the node TAPC of the capacitors C1 and C2. The positive input terminal of the operational amplifier 1 is brought into a complete floating state. Ideally, a voltage corresponding to a capacitance-ratio of the capacitors C1 and C2 is fed to the positive input terminal of the operational amplifier 1. However, in reality, the voltage at the positive input terminal of the operational amplifier 1 gradually lowers due to leakage at the PN-junction of the drain of the transistor switch SW2 connected to the node TAPC, thus increasing the number of operations of the charge pump 3. This results in large power consumption in the waiting mode.

Contrary to this, the resistors R1' and R2' connected to the capacitors C1 and C2 in parallel, as shown in FIG. 5, do not bring the positive input terminal of the operational amplifier 1 into a floating state even in the waiting mode.

The resistance ratio of the resistors R1' and R2' is preferably the same as that of the resistors R1 and R2, however, this is not a must. The resistances of the resistors R1' and R2' are preferably larger than those of the resistors R1 and R2. The former resistance, for example, hundred times the latter limits the current flowing through the resistors R1' and R2' in the waiting mode to 1/100 of the current flowing through the resistors R1 and R2 in the operating mode.

As disclosed above, the third embodiment provided with the second resistor-voltage divider 7 connected in parallel to the capacitor-voltage divider 4 prevents the positive input terminal of the operational amplifier 1 from being brought into a floating state while the charge pump 3 is out of operation. The third embodiment offers a stable voltage level at the positive input terminal of the operational amplifier 1, thus achieving power saving.

Like the second embodiment, the third embodiment is provided with the capacitor-voltage divider 4 for quick suppression of voltage variation in response to a sudden change in up-converted voltage Vpp, thus achieving suppression of voltage variation in up-converted voltage Vpp.

The second resistor-voltage divider 7 may be added to the up-converter shown in FIG. 1, which also prevents the positive input terminal of the operational amplifier 1 from being brought into a floating state while the charge pump 3 is out of operation, thus achieving power saving.

[The Fourth Preferred Embodiment]

The feature of the fourth embodiment lies in depression-type capacitors for avoiding leakage at a transistor PN-junction even in the floating state at the node of the capacitors.

Figure 6:
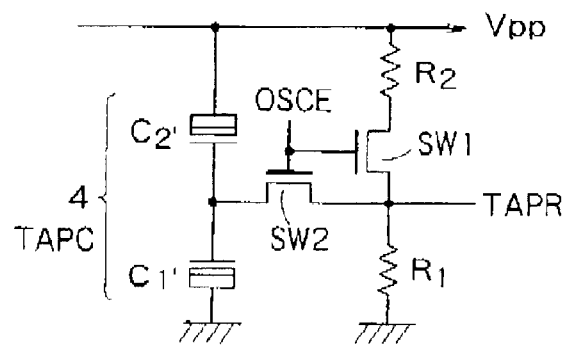
FIG. 6 shows a circuit diagram of a capacitor-voltage divider and its periphery.

Shown in FIG. 6 is a circuit diagram of a capacitor-voltage divider 4 and its periphery. The capacitor-voltage divider 4 is provided with depression-type capacitors C1'and C2'connected in series between the up-converted voltage Vpp and the ground level.

Figure 7:
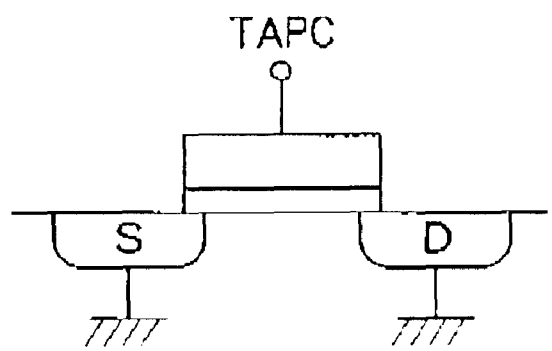
FIG. 7 illustrates a sectional view of a capacitor C1'shown in FIG. 6.

Illustrated in FIG. 7 is a sectional view of the capacitor C1'. The drain D and the source S of a MOS transistor at the ground level do not cause leakage at the PN-junction between the drain terminal and the substrate. On the other hand, the capacitor C2' is constructed such that the drain and the source of a MOS transistor are placed at the power supply voltage level so as not cause leakage at the PN-junction.

Figure 8:
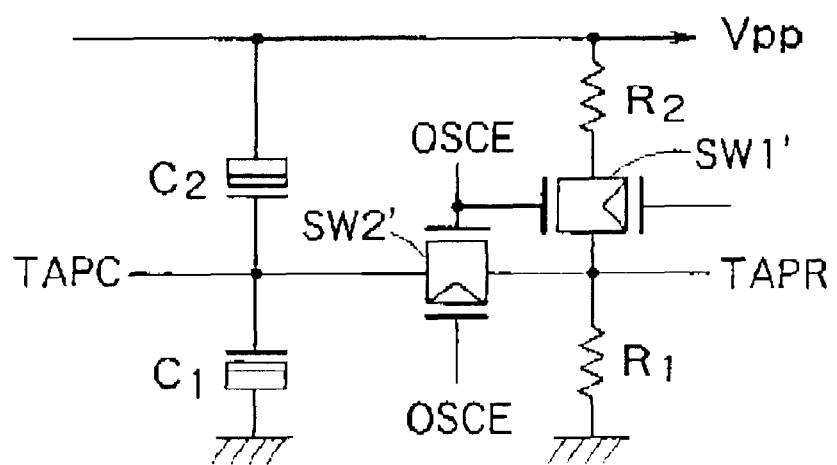
FIG. 8 shows an exemplary circuit diagram where transistor switches SW1 and SW2 in FIG. 6 are replaced with a CMOS-type.

Shown in FIG. 8 is a circuit diagram provided with CMOS-type transistor switches SW1 and SW2. The CMOS-type transistor is not affected by a threshold level of a MOS transistor for accurate voltage transfer to the operational amplifier 1 according to the resistance ratio of the first resistor-voltage divider 5 and the capacitance ratio of the capacitor-voltage divider 4.

[The Other Preferred Embodiments]

The preferred embodiments described so far relate to an up-converter for power saving. However, not only the up-converter, but also the present invention is applicable to a down-converter.

Figure 9:
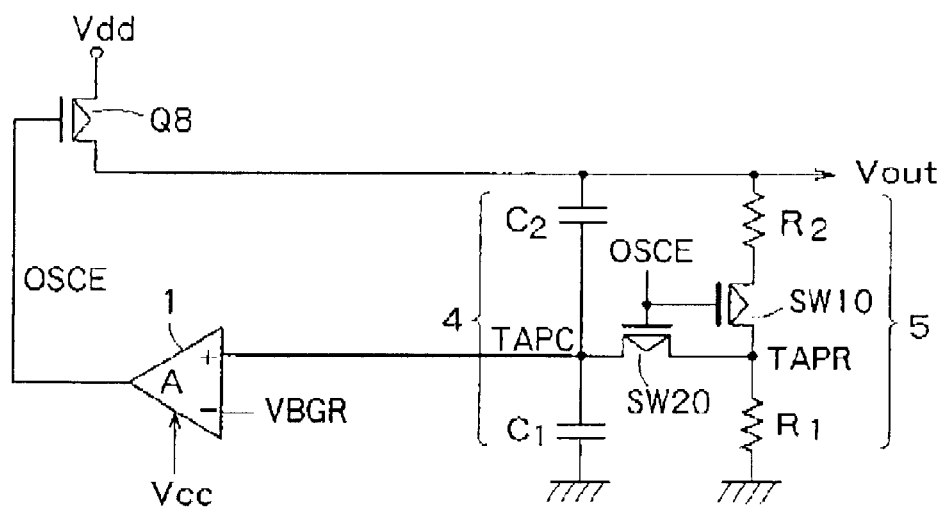
FIG. 9 shows a circuit diagram of a down-converter where a resistor-voltage divider and a capacitor-voltage divider are connected in parallel, like shown in FIG. 1.

Shown in FIG. 9 is a circuit diagram of a down-converter provided with a resistor-voltage divider and a capacitor-voltage divider, like shown in FIG. 1.

Elements in this embodiment that are the same as or analogous to elements in FIG. 1 are referenced by the same reference numbers.

The down-converter (FIG. 9) is provided with an operational amplifier 1, a PMOS transistor Q8, a capacitor-voltage divider 4 constituted by capacitors C1 and C2 connected in series between a down-converted voltage Vout and the ground level, a first resistor-voltage divider 5 constituted by resistors R1 and R2 connected in series between the down-converted voltage Vout and the ground level, a PMOS transistor switch SW10 (the first switch) connected between the resistors R1 and R2, and a PMOS transistor switch SW20 (the second switch) connected between the capacitor-voltage divider 4 and the first resistor-voltage divider 5.

The output OSCE of the operational amplifier 1 is fed to both the gates of the transistor switches SW1O and SW20.

Increase in down-converted voltage Vout higher than a desired voltage brings a divided voltage TAPR of the resistor-voltage divider 5 into a level higher than a reference voltage VBGR. The transition gradually raises the output voltage of the operational amplifier 1, to turn off the transistor Q8 for lowering the down-converted voltage Vout.

The high level-output of the operational amplifier 1 turns off the transistor switches SW10 and SW20, which provides no current flowing therethrough. The down-converted voltage Vout is thus detected only by the capacitors C1 and C2 for power saving.

This embodiment is provided with the capacitor-voltage divider 4 for quick suppression of voltage variation in response to a sudden change in down-converted voltage Vout.

On the other hand, decrease in down-converted voltage Vout lower than the desired voltage brings a divided voltage TAPR of the resistor-voltage divider 5 into a level lower than the reference voltage VBGR. The transition gradually lowers the output voltage of the operational amplifier 1, to turn on the transistor Q8 for raising the down-converted voltage Vout.

Figure 10:
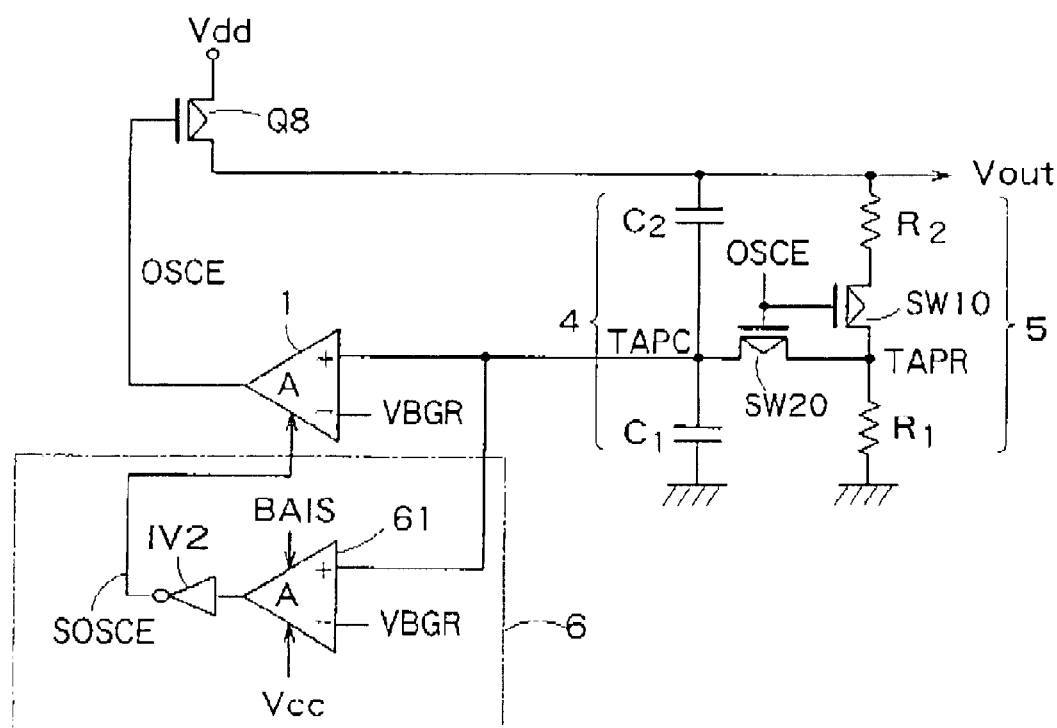
FIG. 10 shows a circuit diagram of a down-converter provided with a power controller that controls a power supply to an operational amplifier, like shown in FIG. 2.

The down-converter shown in FIG. 10 is unique in a power controller 6 that controls a power supply voltage fed to the power supply terminal of the operational amplifier 1.

Elements in this embodiment that are the same as or analogous to elements in FIG. 9 are referenced by the same reference numbers.

The power controller 6 is provided with an operational amplifier 61 (the second operational amplifier) and an inverter IV2 connected to the output terminal of the operational amplifier 61.

The operational amplifier 61 operates at an operating speed slower than the operational amplifier 1, however, is a low power consumption-type with a small operating current, like shown in FIG. 3.

Like the operational amplifier 1, the operational amplifier 61 compares a divided voltage TAPC of the capacitor-voltage divider 4 and the reference voltage VBGR. The power supply voltage Vcc is always supplied to the power supply terminal of the operational amplifier 61, different from the operational amplifier 1.

In FIG. 10, a steady state provides the same voltage to the positive input terminal TAPC and the negative input terminal VBGR of the operational amplifier 1.

Increase in down-converted voltage Vout over a desired voltage raises the output voltage of the operational amplifier 1 to turn off the transistor Q8 for down-conversion operation. The transistors SW10 and SW20 are turned off during down-version operation; hence the down-converted voltage Vout is detected only by the capacitor-voltage divider 4.

Increase in down-converted voltage Vout over the desired voltage also raises the output voltage of the operational amplifier 61 to bring the output voltage of the inverter INV2 into a low level state, thus no power supply voltage being fed to the power supply terminal of the operational amplifier 1.

As disclosed, down-conversion operation provides no current to the operational amplifier 1, for achieving power saving.

On the other hand, decrease in down-converted voltage Vout below the desired voltage lowers the output voltage of the operational amplifier 61 to bring the output voltage of the inverter INV2 into a high level state. The power supply voltage is thus fed to the power supply terminal of the operational amplifier 1 to operate again. The decrease in down-converted voltage Vpp brings the output of the operational amplifier 1 in to a low level to turn on the transistor Q8 for raising the down-converted voltage Vout.

As disclosed above, this embodiment provides no power supply voltage to the operational amplifier 1 during down conversion operation, thus achieving further power saving compared to the embodiment shown in FIG. 9.

Figure 11:
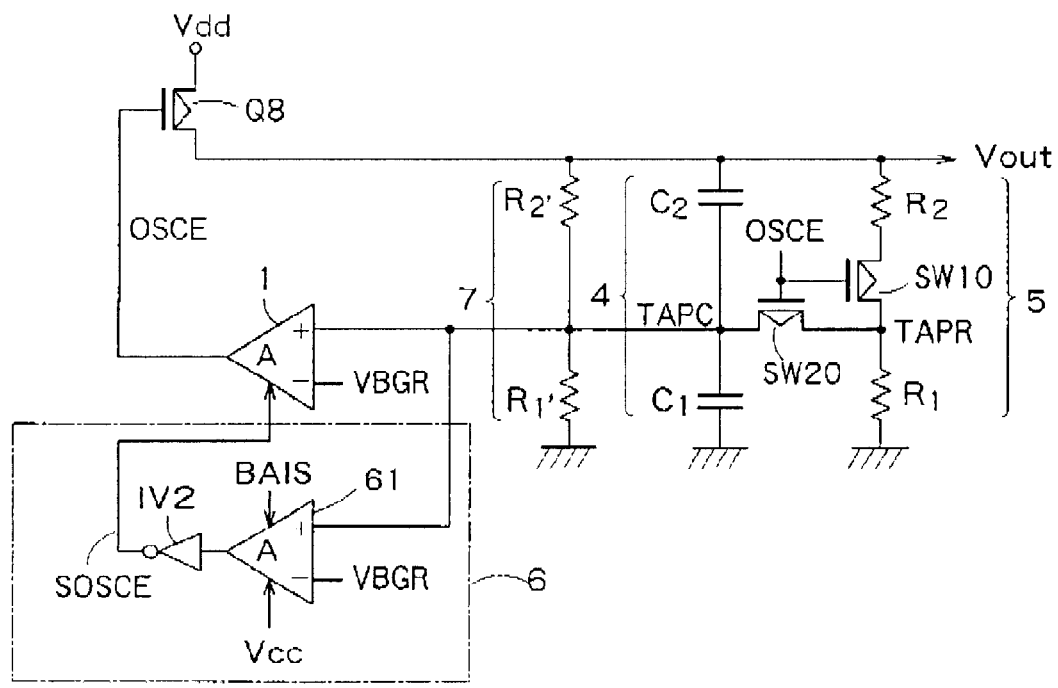
FIG. 11 shows a circuit diagram of a down-converter provided with another resistor-voltage divider.

The embodiment shown in FIG. 11 is unique in a second resistor-voltage divider 7 in addition to the elements shown in FIG. 10. The second resistor-voltage divider 7 is constituted by resistors R1' and R2' connected between the down-converted voltage Vout and the ground level.

In the embodiment shown in FIG. 10, increase in down-converted voltage Vout turns off the transistor switches SW10 and SW20, so that the positive input terminal of the operational amplifier 1 is connected only to the node TAPC of the capacitors C1 and C2. The positive input terminal of the operational amplifier 1 is brought into a complete floating state. Ideally, a voltage corresponding to a capacitance-ratio of the capacitors C1 and C2 is fed to the positive input terminal of the operational amplifier 1. However, in reality, the voltage at the positive input terminal of the operational amplifier 1 gradually lowers due to leakage at the PN-junction of the drain of the transistor switch SW20 connected to the node TAPC, to turn on the transistor Q8, thus increasing the number of operations of raising the down-converted voltage Vout. This results in large power consumption in the waiting mode.

Contrary to this, the resistors R1' and R2' connected to the capacitors C1 and C2 in parallel, as shown in FIG. 11, do not bring the positive input terminal of the operational amplifier 1 into a floating state.

The resistance ratio of the resistors R1' and R2' is preferably the same as that of the resistors R1 and R2, however, this is not a must. The resistances of the resistors R1' and R2' are preferably larger than those of the resistors R1 and R2.

The former resistance, for example, hundred times the latter limits the current flowing through the resistors R1' and R2' in the waiting mode to 1/100 of the current flowing through the resistors R1 and R2 in the operating mode.

As disclosed above, the embodiment shown in FIG. 11 provided with the second resistor-voltage divider 7 connected in parallel to the capacitor-voltage divider 4 prevents the positive input terminal of the operational amplifier 1 from being brought into a floating state while lowering the down-converted voltage Vout. This embodiment offers a stable voltage level at the positive input terminal of the operational amplifier 1, thus achieving power saving.

Like the embodiment shown in FIG. 9, this embodiment is provided with the capacitor-voltage divider 4 for quick suppression of voltage variation in response to a sudden change in down-converted voltage Vout, thus achieving suppression of voltage variation in down-converted voltage Vout.

The down-converters shown in FIGS. 9 to 11 are constructed almost same as the up-converters, such as, shown in FIG. 1, except the transistor Q9 instead of the ring oscillator 2 and the charge pump 3 and the PMOS transistor switches TW10 and TW20 instead of the NMOS transistor switches TW1 and TW2. Therefore, the present invention achieves power saving with a small chip size also in the down-converter.

As disclosed above, according to the present invention, the internal voltage, such as, the up-converted voltage and the down-converted voltage, is detected by the capacitor-voltage divider while no current is flowing through the resistor-voltage divider in the waiting mode where the internal voltage generator is out of operation. The present invention therefore achieves power saving in the waiting mode.

Moreover, since the capacitor-voltage divider quickly follows internal voltage variation, the present invention achieves a feedback control to regain a desired internal voltage even if it varies suddenly.

What is claimed is:

1. A semiconductor device comprising:
   an internal voltage generator for generating an internal voltage that is obtained by up-converting or down-converting an external power supply voltage;
   a first resistor-voltage divider, having a plurality of first resistors, to output a first divided voltage that is obtained by dividing said internal voltage according to a resistance ratio of said first resistors;
   a capacitor-voltage divider, having a plurality of capacitors connected in series between an output terminal of said internal voltage generator and a ground level, to output a second divided voltage from a node of said capacitors; and
   a comparator to compare a reference voltage and said first divided voltage for controlling said internal voltage generator according to a result of comparison, said comparator judging whether to halt operation of said internal voltage generator or not based on the result of comparison between said reference voltage and first divided voltage while said internal voltage generator is operating, on the other hand, controlling said internal voltage generator based on the result of comparison between said reference voltage and second divided voltage while said internal voltage generator is not operating, and controlling said first resistor-voltage divider so that a current flows therethrough only while said internal voltage generator is operating.

2. The semiconductor device according to claim 1 further comprising:
   a first switch to switch a current whether or not to flow through each resistor of said first resistor-voltage divider; and
   a second switch arranged between a divided-voltage output terminal of said first resistor-voltage divider and that of said capacitor-voltage divider,
   wherein, when said internal voltage that is obtained by up-converting or down-converting said external power supply voltage exceeds a predetermined voltage, said comparator controls said first switch so that no current flows through each resistor of said first resistor-voltage divider, and controls said second switch so that the divided-voltage output terminal of said first resistor-voltage divider and the divided-voltage output terminal of said capacitor-voltage divider are disconnected from each other, to judge whether to operate said internal voltage generator or not based on the result of comparison between said reference voltage and second divided voltage,
   on the other hand, when the internal voltage that is obtained by up-converting or down-converting said externally-supplied power supply voltage is equal to or lower than said predetermined voltage, said comparator controls said first switch so that a current flows through each resistor of said first resistor-voltage divider, and controls said second switch so that the divided-voltage output terminal of said first resistor-voltage divider and the divided-voltage output terminal of said capacitor-voltage divider are connected to each other, and judges whether to halt operation of said internal voltage generator or not based on the result of comparison between said reference voltage and first divided voltage.

3. The semiconductor device according to claim 1, wherein said comparator includes a first operational amplifier to output a signal indicating whether to operate said internal voltage generator, said first operational amplifier outputting a voltage according to the result of comparison between said reference voltage and first divided voltage while said internal voltage generator is operating, on the other hand, outputting a voltage according to the result of comparison between said reference voltage and second divided voltage while said internal voltage generator is out of operation.

4. The semiconductor device according to claim 3, wherein said comparator includes a second operational amplifier to switch a power supply voltage whether or not to be supplied to said first operational amplifier, said second operational amplifier deciding whether or not to supply said power supply voltage to said first operational amplifier according to the result of comparison between said reference voltage and first divided voltage while said internal voltage generator is operating, on the other hand, deciding whether or not to supply said power supply voltage to said first operational amplifier according to the result of comparison between said reference voltage and second divided voltage while said internal voltage generator is out of operation.

5. The semiconductor device according to claim 4, wherein said second operational amplifier consumes power smaller than said first operational amplifier.

6. The semiconductor device according to claim 1 further comprising a second resistor-voltage divider, having a plurality of second resistors, to output a third divided voltage that is obtained by dividing said internal voltage according to a resistance ratio of said second resistors, an output terminal of said second resistor-voltage divider being connected to the output terminal of said capacitor-voltage divider.

7. The semiconductor device according to claim 6, wherein the resistance ratio of said first resistors and that of said second resistors are almost equal to each other, and impedance of said first resistors is smaller than that of said second resistors.

8. The semiconductor device according to claim 1, wherein each capacitor of said capacitor-voltage divider includes a depression-type MOS transistor.

9. The semiconductor device according to claim 2, wherein said first and second switches include a CMOS transistor.

10. A semiconductor device comprising:
an internal voltage generator for generating an internal voltage that is obtained by up-converting or down-converting an external power supply voltage;
a resistor-voltage divider, having a plurality of resistors, to output a first divided voltage that is obtained by dividing said internal voltage according to a resistance ratio of said resistors;
a capacitor-voltage divider, having a plurality of capacitors connected in series between an output terminal of said internal voltage generator and a ground level, to output a second divided voltage from a node of said capacitors; and
a comparator to compare a reference voltage and said first divided voltage for controlling said internal voltage generator according to a result of comparison, said comparator controlling said first resistor-voltage divider so that no current flows therethrough while said internal voltage generator is out of operation, to operate said internal voltage generator based on the result of comparison between said reference voltage and second divided voltage.

11. The semiconductor device according to claim 10 further comprising:
a first switch to switch a current whether or not to flow through each resistor of said first resistor-voltage divider; and
a second switch arranged between a divided-voltage output terminal of said first resistor-voltage divider and a divided-voltage output terminal of said capacitor-voltage divider,
wherein, when said internal voltage that is obtained by up-converting or down-converting said external power supply voltage exceeds a predetermined voltage, said comparator controls said first switch so that no current flows through each resistor of said first resistor-voltage divider, and controls said second switch so that the divided-voltage output terminal of said first resistor-voltage divider and the divided-voltage output terminal of said capacitor-voltage divider are disconnected from each other.

12. A method of controlling an internal voltage of a semiconductor device, comprising the steps of:
generating an internal voltage that is obtained by up-converting or down-converting an external power supply voltage;
outputting a first divided voltage that is obtained by dividing said internal voltage according to a resistance ratio of a plurality of resistors;
connecting said internal voltage and a ground level via capacitance, to output a second divided voltage by the capacitance-coupling;
judging whether or not to halt the internal voltage generation according to a result of comparison between a reference voltage and said first divided voltage while the internal voltage generation is proceeding, on the other hand, starting the internal voltage generation according to the result of comparison between said reference voltage and second divided voltage while the internal voltage generation is not proceeding; and
outputting said first divided voltage only when the voltage obtained by up-converting or down-converting said external power supply voltage is being generated.

13. The controlling method according to claim 12 further comprising the steps of:
placing said first divided voltage at said ground level when the internal voltage that is obtained by up-converting or down-converting said external power supply voltage exceeds a predetermined voltage;
electrically isolating said first divided voltage as placed at said ground level from said capacitance-coupling;
judging whether or not to proceed the internal voltage generation according to the result of comparison between said reference voltage and second divided voltage;
placing said first divided voltage at a voltage obtained according to said resistance ratio when the internal voltage obtained by up-converting or down-converting said external power supply voltage is equal to or lower than said predetermined voltage;
electrically connecting said first divided voltage placed as the voltage obtained according to said resistance ratio and capacitance-coupling; and
judging whether or not to halt the internal voltage generation according to the result of comparison between said reference voltage and first divided voltage placed as the voltage obtained according to said resistance ratio.

14. A method of controlling an internal voltage of a semiconductor device, comprising the steps of:
generating an internal voltage that is obtained by up-converting or down-converting an external power supply voltage;
outputting a first divided voltage that is obtained by dividing said internal voltage according to a resistance ratio of a plurality of resistors;
connecting said internal voltage and a ground level via capacitance, to output a second divided voltage by the capacitance-coupling;
placing said first divide-voltage as a ground level when said internal voltage obtained by up-converting or down-converting said external power supply voltage is not generated;
starting the internal voltage generation according to the result of comparison between a reference voltage and said second divided voltage.

15. The controlling method according to claim 14 further comprising the steps of:
placing said first divided voltage at said ground level when the internal voltage obtained by up-converting or down-converting said external power supply voltage exceeds a predetermined voltage; and
electrically isolating said first divided voltage as placed at said ground level from said capacitance-coupling.

* * * * *